United States Patent
Barr et al.

(12) 
(10) Patent No.: US 6,812,719 B1
(45) Date of Patent: Nov. 2, 2004

(54) ELECTRONIC PROBE WITH A TIP THAT IS SECURABLE TO AN ELECTRONIC DEVICE

(75) Inventors: Andrew Harvey Barr, Roseville, CA (US); Robert William Dobbs, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/447,798

(22) Filed: May 28, 2003

(51) Int. Cl.[7] .............................................. G01R 31/02
(52) U.S. Cl. ...................................... 324/754; 324/758
(58) Field of Search ......................... 324/72.5, 754–755, 324/758, 761–762, 765; 439/169, 174, 482, 912

(56) References Cited

U.S. PATENT DOCUMENTS

| | | | | |
|---|---|---|---|---|
| 4,806,856 A | * | 2/1989 | Hvezda et al. | 324/761 |
| 5,446,393 A | * | 8/1995 | Schaefer | 324/754 |
| 5,457,392 A | * | 10/1995 | Filipescu | 324/555 |
| 6,462,529 B1 | * | 10/2002 | Campbell | 324/72.5 |

* cited by examiner

*Primary Examiner*—Minh N. Tang

(57) ABSTRACT

A signal probe includes a conductive probe tip for contacting a signal node of an electronic device, and a mount to hold the tip in contact with the node. With such a probe, a technician no longer has to hold the probe to maintain contact with a signal node, such as a lead of a component.

21 Claims, 3 Drawing Sheets

ELECTRONIC PROBE WITH A TIP THAT IS SECURABLE TO AN ELECTRONIC DEVICE

BACKGROUND

Many electronic devices, such as computers and stereos, include a circuit board that contains the device's circuitry and/or components for operating the device. For example, a circuit board may include a microprocessor component for executing instructions and a memory component for storing data. These and other components are frequently mounted to a circuit board and coupled to a circuit of the board by attaching a small conductive lead of the component to a conductive pad on the circuit board. When electronic devices malfunction or when the design or manufacture of the device is not complete, a technician often tests/diagnosis the device by probing the component leads with a probe coupled to a measuring device such as an oscilloscope.

To probe a lead of a component that is attached to a circuit board, the technician typically contacts a conductive tip of the probe to the node and then holds the probe with his/her hand to maintain contact. Thus, probing a lead typically requires the technician to use one of his/her hands to support the probe.

Holding the probe with a hand while testing/diagnosing an electronic device, however, is often clumsy and awkward. Frequently, testing/diagnosing requires a technician to probe a circuit and/or component for long periods of time, and thus, often requires the technician to hold the probe for a long period of time to complete the test/diagnosis. Holding the probe for a long period frequently tires the technician's hand, wrist and/or arm, which can cause the technician to lose contact between the probe and the signal lead of a component. If contact is not maintained, the signal sensed by the probe may be degraded or lost, and the test/diagnosis may be inaccurate. In addition, testing/diagnosing an electronic device frequently requires a technician to operate the controls of the measuring device (oscilloscope) while probing the component. This often causes the technician to lose his/her concentration on maintaining contact between the probe and the lead of the component. Furthermore, testing/diagnosing an electronic device may require contacting two or more probes to respective component leads, and thus, require two or more technicians to hold the probes, which may be difficult in a tight space and is often an inefficient use of resources.

A solution to this problem is to use a probe with a conductive tip in the shape of hook to help the technician maintain contact between the tip and the signal lead of the component. For example, FIG. 1 shows a conventional probe 10 contacting a component 12 mounted to a circuit board 14 to probe the component 12. The component 12 includes a signal lead 16 attached to a node 17 of the circuit 14. The probe 10 includes a conductive tip 18 in the shape of hook that contacts and grabs the signal lead 16 when the technician pulls the probe 10 away from the component 12.

Unfortunately, this solution has a problem. To maintain contact between the conductive lead 16 and the tip 18 of the component 12, the technician must continue to pull the probe 16 away from the component 12, and thus must hold the probe 10 during the testing/diagnosing of the component 12.

SUMMARY

In one aspect of the invention, a signal probe tip includes a conductive tip to contact a signal lead of an electronic device, and a mount to hold the tip against the lead. With such a probe, a technician no longer has to hold the probe to maintain contact between the signal lead and the probe tip.

DETAILED DESCRIPTION

The following discussion is presented to enable one skilled in the art to make and use the invention. Various modifications to the disclosed embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Figure 1:
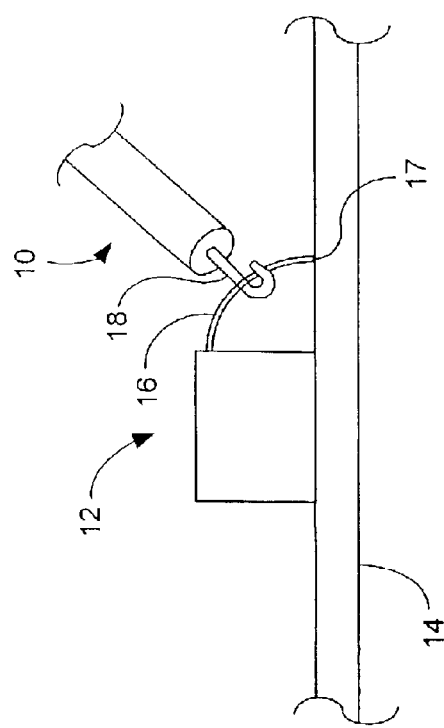
FIG. 1 is a view of a conventional probe having a Up for contacting a signal lead.
Figure 2:
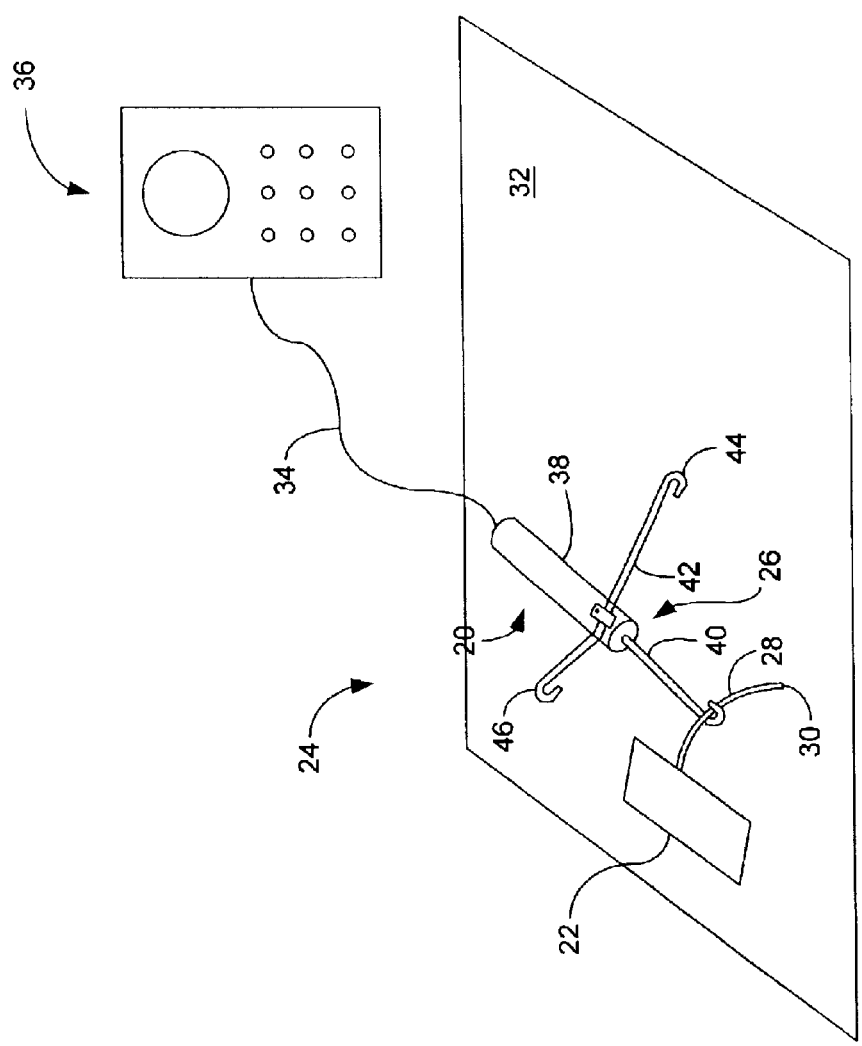
FIG. 2 is a view of a probe and a signal lead being probed according to an embodiment of the invention.

FIG. 2 is a perspective view of a probe 20 and a component 22 of an electronic device 24 being probed by the probe 20 according to an embodiment of the invention. As discussed below, the probe 20 may be anchored to the device 20. The component 22 includes a component lead 28 that is coupled to a signal node 30 of a circuit board 32 of the electronic device 24. A cable 34 couples the probe 20 to an oscilliscope 36, which receives and displays the probed signal. The probe 20 may be an active probe, such as a high frequency probe that includes circuitry (not shown) within the probe body 38, or may be a passive probe.

The probe 20 includes a conductive hooked tip 40 for contacting the component lead 28 of the component 22 or any other signal node (not shown) of the electronic device 24 such as a post. The probe 20 also includes a mount 42 that may be fastened to the electronic device 24 to anchor the probe 20 and hold the probe tip 40 in contact with the component lead 28. Thus, a technician may probe the component 22 without holding the probe 20 to maintain contact between the component lead 28 and the probe tip 40. Furthermore, the probe tip 40 and the mount 42, or portions thereof, may be removable and replaceable.

The mount 42 may be fastened to the electronic device 24 or elsewhere using any desired fastening technique. Furthermore, the mount 42 may be releasably fastened to the electronic device 24 to allow the probe 20 to be re-anchored at other desired locations on the same electronic device 24 or on a different electronic device. For example, the mount 42 may include a hook 44 (discussed in greater detail in conjunction with FIG. 3) that may be inserted into different sized receptacles (not shown)—typically holes having different diameters in the circuit board 32—to allow a technician to reuse the mount 42 to anchor the tip 26 to different locations on the electronic device 24. In another embodiment, the mount 42 may include a magnet (not shown) to magnetically couple the mount 42 to magnetic material in the electronic device 24 such as a metal component of the circuit board 32 or metal housing (not shown). Furthermore, the mount 42 may be fastened to the electronic device 24 using any conventional technique. In addition, the mount 42 may be designated for one-time use only, and thus may be more permanently mounted to the electronic device 24 using conventional adhesive or other type of conventional fastening technique.

Figure 3:
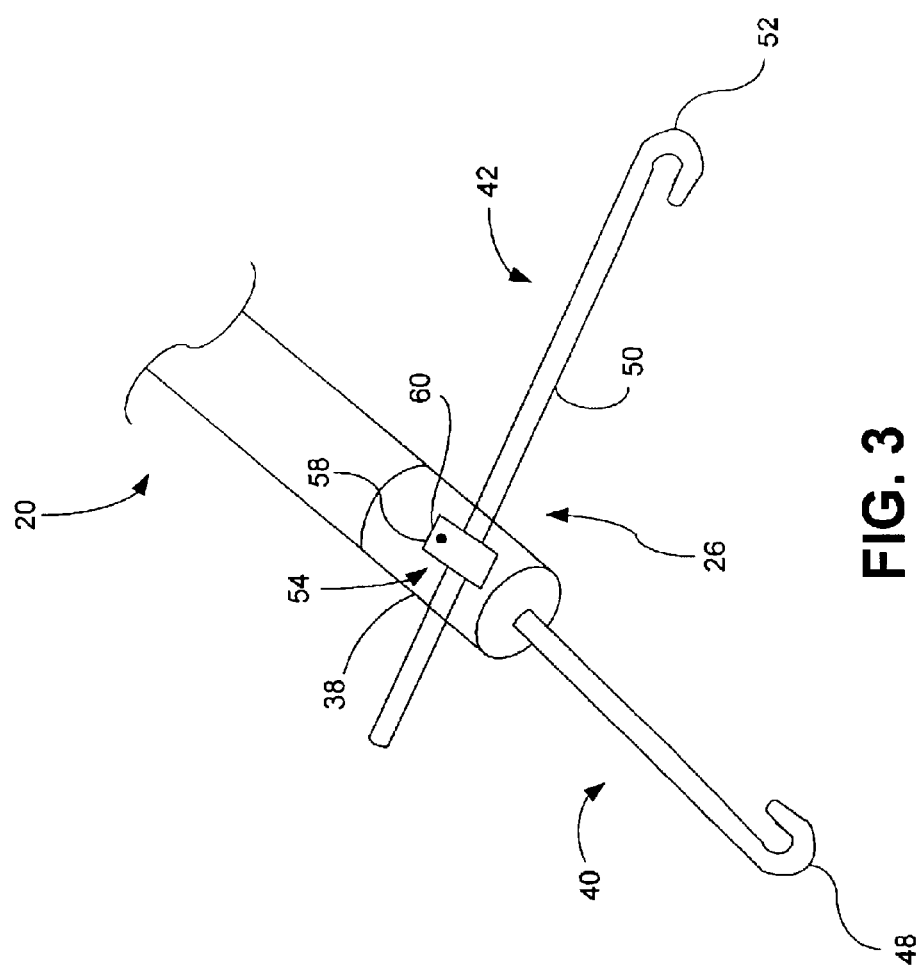
FIG. 3 is a close-up view of the probe in FIG. 2 according to an embodiment of the invention.

Still referring to FIG. 2, the mount 42 may be adjustable to allow the mount 42 to be fastened to the electronic device 24 at any desired location and may include a locking element (not shown but discussed in greater detail in conjunction with FIG. 3) to retain the mount 42 in different positions. For example, the length of the mount 42 may be adjusted to fasten the mount 42 to a region of the electronic device 24 that is several inches away from the component lead 28, and the locking element may retain the mount 42 at this length. The mount 42 may then be re-adjusted to fasten the mount 42 different distances away from the component lead 28, and the locking element may retain the mount 42 at this new adjusted length. In an alternative embodiment, the angular position of the mount 42 relative to the probe 20 may be adjusted to avoid contact between the probe 20 and another component (not shown) of the electronic device 24 while anchoring the probe 20 to a particularly desirable region of the device 24, such as a region of the circuit board 32 or housing (not shown) located above the board 32.

Other embodiments of the probe 20 are contemplated. For example, the probe 20 may include two or more mounts 42 to anchor the probe 20 to two or more desired locations on the electronic device 24. This may be desirable to more securely hold the probe tip 40 in contact with the lead 28. The additional mounts 42 may be attached to various locations on the probe body 38. In addition, the mounts 42 may be attached to locations external to the board 32 and device 24.

In operation, a technician may couple the probe 20 to the electronic device 24 to probe the component 22 and/or a circuit of the circuit board 32 as follows. Although the following coupling process is described in a particular sequence of events, the sequence may be altered as desired without significant affect. First, a technician hooks the probe tip 40 around the component lead 28. Then, the technician positions the probe 20 relative to the component 22 as desired. Next, the technician inserts the hook 44 of the mount 42 into a receptacle of the circuit board 32 to fasten the mount 42 to the electronic device 24, and thus hold the Up 40 against the lead 28. Then, the technician may pull the free end 46 to take up slack in the mount 42, and thus cause the mount 42 to pull the conductive probe tip 40 against the lead 28 and toward the hook 44 of the mount 42. The technician may then lock the mount 42 at the desired length. With the probe tip 40 secured to the component lead 28, the technician does not have to hold the probe 20 to maintain contact between the tip 40 and the lead 28.

FIG. 3 is a close-up view of the probe 20 of FIG. 2 according to an embodiment of the invention. The probe 20 includes a tip end 26 that may be anchored to the electronic device 24 (FIG. 2), and thus may hold the hooked probe tip 40 against the component lead 28 (FIG. 2). The tip end 26 also includes the mount 42 to anchor the probe 20 to the electronic device 24.

As discussed above, in one embodiment, the probe tip 40 includes an end 48 that is curved to hold the tip 40 against the component lead 28, and may be made from any desired, electrically conductive material such as copper. The mount 42 includes a tether 50 having a hook 52 to fasten the tether 50 to the electronic device 24 (or elsewhere), and a locking element 54 to secure the tether 50 to a body 38 of the probe 20. In other embodiments, the tether 50 may include other components that are capable of fastening the tether 50 to the electronic device 24, such as a screw, adhesive and/or magnet. The tether 50 and hook 52 may be made of any desired material such as any conventional rubber. For example, the tether 50 may be made of a material that allows the tether 50 to stretch by elastically deforming Thus, the length of the tether 50 may be adjusted by elastically deforming the material. In other embodiments, the hook 52 may be made of any other desired material, such as conventional plastics, that is capable of resisting bending, and may be attached to the tether 50 using conventional techniques.

Furthermore, the probe tip 40 may be other than hook-shaped.

Still referring to FIG. 3, in one embodiment, the locking element 54 includes a plate 58 coupled to the body 38 with a screw 60. The screw 60 includes a thread (not shown) that is inserted through a hole (not shown) in the plate 58 and received by corresponding threads (not shown) in the body 38. Thus, the screw 60 may be turned in one direction to move the plate 58 toward the body 38 and turned in another direction to move the plate 58 away from the body 38. To retain the tether 50 at a desired length between the hook 52 and the locking element 54, i.e., a desired position, the plate 58 and body 38 frictionally hold the tether 50 between them. Thus, once established, the desired position is retained by turning the screw 60 to move the plate 58 toward the body 38. To release the tether from the position and re-adjust the length of the tether 50 between the hook 52 and the locking element 54, the screw 60 is turned to move the plate 58 away from the body 38.

Other embodiments of the locking element 54 are contemplated. For example, the locking element may include a cleat that may be inserted into a hole in the tether, or, one end of the tether 50 may be permanently attached to the body 38, and a buckle or other adjustment device may allow adjustment of the tether length. Furthermore, the locking element may include a jaw with teeth, such as an alligator clip, that is biased to a closed position with a spring.

What is claimed is:

1. A signal probe, comprising:

a conductive tip operable to contact a signal node of an electronic device; and a mount operable to hold the tip in contact with the node, the mount being adjustable and fastenable to the electronic device at any one of a plurality of locations other than the signal node.

2. The probe of claim 1 wherein the conductive tip includes a hooked end.

3. The probe of claim 1 wherein the mount is releasably attachable to the electronic device.

4. The probe of claim 1 wherein the mount is adjustable and includes a locking element operable to retain the mount in different positions.

5. The probe of claim 1 wherein the mount includes a tether.

6. The probe of claim 1 wherein the mount includes:

a tether having an end operable to be fastened to the electronic device; and a locking element operable to retain the tether at different lengths.

7. The probe of claim 6 wherein the end of the tether includes a hook operable to fasten the tether to the electronic device.

8. The probe of claim 6 wherein the tether includes a material operable to allow the tether to stretch by elastically deforming.

9. A method comprising:
- contacting a signal node of an electronic device with a signal-probe tip;
- adjusting a mount to reach any one of a plurality of locations of the electronic device other than the signal node; and
- attaching the mount to the location to hold the tip in electrical contact with the signal node.

10. The method of claim 9 wherein contacting the signal node includes contacting the signal node with a curved end of the tip.

11. The method of claim 9 wherein attaching the mount comprises attaching the mount to pull the probe tip against the node.

12. The method of claim 9 wherein attaching the mount includes hooking a region of an electronic device that includes the signal node with a hook.

13. The method of claim 9 wherein adjusting the mount includes:
- adjusting a length of the mount; and
- retaining the mount at the desired length.

14. The method of claim 9, further comprising:
- releasing the mount; and
- removing the tip from the node.

15. The method of claim 9 wherein adjusting the mount includes adjusting an angular position of the mount relative to a signal-probe including the signal-probe tip.

16. A signal probe, comprising:
- a body;
- a conductive tip operable to contact a signal node of an electronic device; and
- a tether having an end operable to be fastened to the electronic device, and a locking element operable to retain the tether at different lengths.

17. The probe of claim 16 wherein the end of the tether includes a hook operable to fasten the tether to the electronic device.

18. The probe of claim 16 wherein the tether includes a rubber band.

19. The probe of claim 16 wherein the locking element includes a plate movable toward the body of the probe to retain the tether and movable away from the body to change the length of the tether.

20. The signal probe of claim 16 wherein the tether is flexible.

21. The signal probe of claim 16 wherein the tether is rigid.

* * * * *